(12) United States Patent
Matsuda et al.

(10) Patent No.: US 6,764,585 B2
(45) Date of Patent: Jul. 20, 2004

(54) ELECTRONIC DEVICE MANUFACTURING METHOD

(75) Inventors: Tetsuo Matsuda, Yokohama (JP); Hiroshi Toyoda, Yokohama (JP); Hisashi Kaneko, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 264 days.

(21) Appl. No.: 09/985,051

(22) Filed: Nov. 1, 2001

(65) Prior Publication Data

US 2002/0050459 A1 May 2, 2002

(30) Foreign Application Priority Data

Nov. 2, 2000 (JP) ........................................ 2000-336194

(51) Int. Cl.[7] .......................... B05D 5/12; H01L 21/44; H01L 21/31; C25D 5/02
(52) U.S. Cl. ........................... 205/118; 427/97; 427/98; 438/675; 438/763; 205/123
(58) Field of Search ................. 205/118, 123; 427/97, 98; 438/675, 763

(56) References Cited

U.S. PATENT DOCUMENTS 5,529,954 A    6/1996  Iijima et al. ................ 437/189
5,969,422 A  * 10/1999  Ting et al. ................... 257/762
6,197,181 B1   3/2001  Chen .......................... 205/123
6,555,171 B1 *  4/2003  Lopatin ....................... 427/305

FOREIGN PATENT DOCUMENTS

JP            2000-183160          6/2000

OTHER PUBLICATIONS

Tetsuo Matsuda et al., "Film Formation Method", Ser. No. 09/371,221, filed Aug. 10, 1999.

* cited by examiner

Primary Examiner—Edna Wong
(74) Attorney, Agent, or Firm—Finnegan, Henderson, Farabow, Garrett & Dunner, L.L.P.

(57) ABSTRACT

An electronic device manufacturing method comprises forming an insulating film above a substrate, forming a to-be-filled region which includes at least one of an interconnection groove and a hole in the insulating film, forming a first conductive film containing a catalyst metal which accelerates electroless plating, so as to line an internal surface of the to-be-filled region, forming a second conductive film on the first conductive film by the electroless plating, so as to line the internal surface of the to-be-filled region via the first conductive film, and forming a third conductive film on the second conductive film by electroplating, so as to fill the to-be-filled region via the first conductive film and the second conductive film.

12 Claims, 6 Drawing Sheets

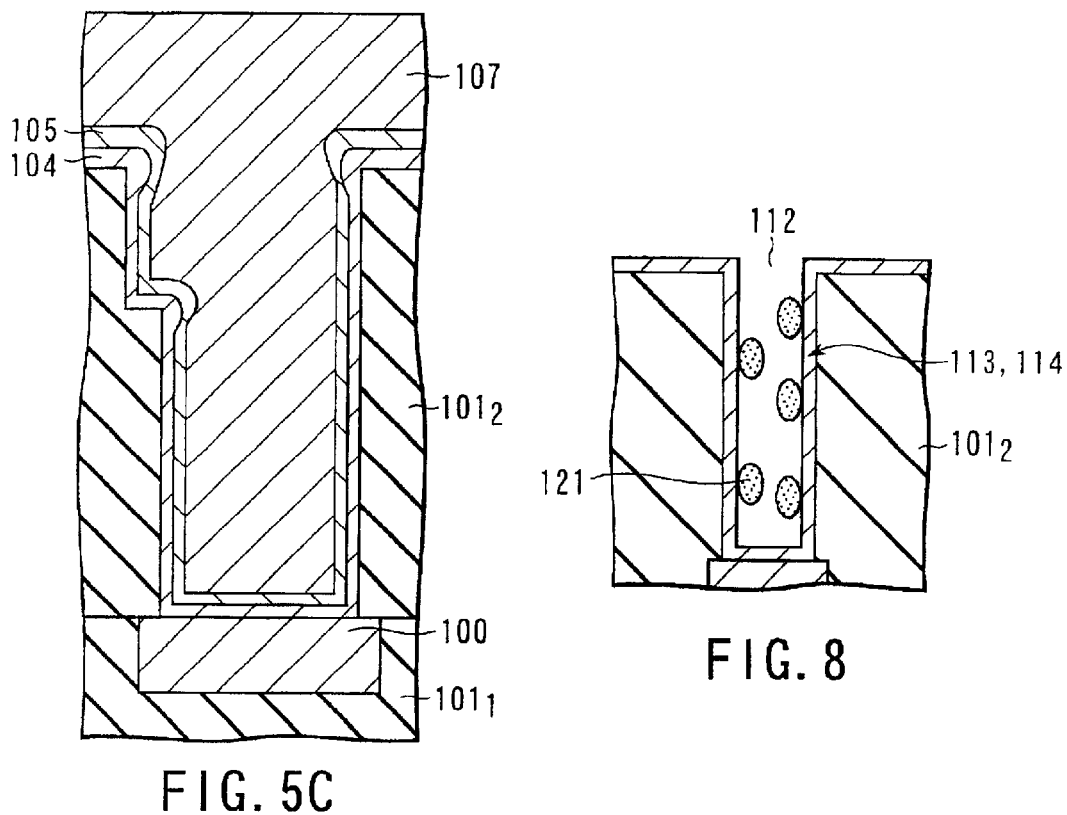
FIG. 5C
FIG. 8
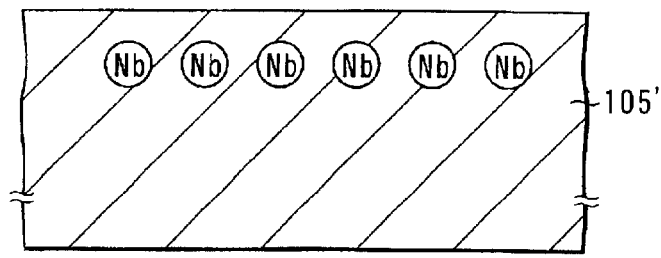
FIG. 6A
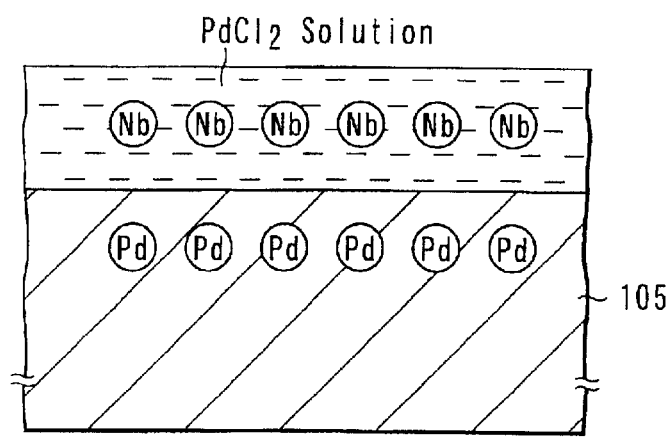
FIG. 6B

ELECTRONIC DEVICE MANUFACTURING METHOD

CROSS-REFERENCE TO RELATED APPLICATIONS

This application is based upon and claims the benefit of priority from the prior Japanese Patent Application No. 2000-336194, filed Nov. 2, 2000, the entire contents of which are incorporated herein by reference.

BACKGROUND OF THE INVENTION

1. Field of the Invention

This invention relates to a manufacturing method of electronic devices such as semiconductor circuits (LSI) and magnetic circuits, and more particularly to an electronic device manufacturing method containing a step of filling a conductive film into the internal portion of a to-be-filled region such as an interconnection groove and contact/via hole by plating.

2. Description of the Related Art

Conventionally, an Al interconnection containing Al as a main component is often used for an interconnection of an LSI or the like. However, recently, an interconnection (Cu interconnection) containing copper (Cu) as a main component by the damascene method is dominantly used.

This is because Cu has characteristics of a lower resistivity than that of Al, and a higher melting point. As a result, a Cu interconnection using the damascene method has various advantages for miniaturization. More specifically, the RC delay is improved upon and the EM (electromigration) resistance is enhanced.

When a Cu interconnection is formed by use of the damascene method, it is necessary to form a Cu film on the entire surface so as to fill the Cu film into the internal portion of an interconnection groove, or an interconnection groove and contact hole previously formed in an interlayer dielectric.

As one of the forming methods of this type of Cu film, a method using electroplating is known. In this method, the inner wall of an interconnection groove or the like is previously coated with a Cu film (Cu seed film) used as a seed prior to formation of the Cu film. The Cu seed film is also called a "current introducing film", and is formed by use of the sputtering method.

However, since the sputtering method does not provide good step coverage, the film thickness of a Cu seed film 63 becomes less in a portion near the bottom portion of an contact hole formed in an interlayer dielectric 61 as shown in FIG. 1 when the aspect ratio of the interconnection groove or contact hole increases, as the element is further miniaturized. On the other hand, in a portion near the opening portion of the interconnection groove or contact hole, an eaves-like overhang of the Cu seed film 63 is formed. In FIG. 1, reference numeral 62 denotes a barrier metal film, 64 denotes a Cu film used as an interconnection, and 65 denotes a Cu film of the underlying interconnection.

If the film thickness of the Cu seed film 63 is further reduced in the portion near the bottom portion of the contact hole, the function of the Cu seed film 63 used as the current introducing film is lost in this portion, and in the worst case, electroplating does not occur at all. That is, if the film thickness of the Cu seed film 63 is reduced in the portion near the bottom portion of the contact hole, the filling shape or buried shape of the Cu film 64 deteriorates.

The above problem can be solved by depositing a thick Cu seed film 63 by sputtering, but at this time, since the overhang becomes significantly large, a plating solution cannot be supplied to the bottom of the contact hole. Therefore, in this case, the filling shape of the Cu film 64 deteriorates.

As an attempt to solve the above problem, a method for forming a Cu thin film on a Cu seed layer by electroless plating after the relatively thin Cu seed layer having a small overhang is formed and before a Cu film is formed as an interconnection by electroplating is proposed.

However, the inventors of this application have found that the growth nucleus density of the Cu thin film formed on the Cu seed layer by electroless plating is low, and significantly uneven portions are formed on the surface of the Cu thin film. The uneven portions obstruct the electroplating and make it difficult to fill the Cu film into the contact hole or the like. As a result, the filling shape of the Cu film deteriorates.

As described above, there occurs a problem that it becomes difficult to form a Cu film having a good filling shape in the internal portion of the interconnection groove or contact hole by plating when the aspect ratio of the interconnection groove or contact hole increases as the element is further miniaturized. Therefore, it becomes necessary to provide an electronic device manufacturing method which can form a conductive film having a good filling shape in the internal portion of a to-be-filled region with high aspect ratio by plating.

BRIEF SUMMARY OF THE INVENTION

An electronic device manufacturing method according to a first aspect of this invention comprises forming an insulating film above a substrate; forming a to-be-filled region which includes at least one of an interconnection groove and a hole in the insulating film; forming a first conductive film containing a catalyst metal which accelerates electroless plating, so as to line an internal surface of the to-be-filled region; forming a second conductive film on the first conductive film by the electroless plating, so as to line the internal surface of the to-be-filled region via the first conductive film; and forming a third conductive film on the second conductive film by electroplating, so as to fill the to-be-filled region via the first conductive film and the second conductive film.

An electronic device manufacturing method according to a second aspect of this invention comprises forming an insulating film above a substrate; forming a to-be-filled region which includes at least one of an interconnection groove and a hole in the insulating film; forming a first conductive film containing a preset material, so as to line an internal surface of the to-be-filled region; and forming a second conductive film on the first conductive film by plating, growth nucleus density of the second conductivity film being enhanced by use of the preset material.

An electronic device manufacturing method according to a third aspect of this invention comprises forming an insulating film above a substrate; forming a to-be-filled region which includes at least one of an interconnection groove and a hole in the insulating film; forming a conductive amorphous film so as to line an internal surface of the to-be-filled region; and forming a conductive film on the conductive amorphous film by plating so as to fully fill the to-be-filled region via the conductive amorphous film.

An electronic device manufacturing method according to a fourth aspect of this invention comprises forming an insulating film above a substrate; forming a to-be-filled region which includes at least one of an interconnection groove and a hole in the insulating film; forming a first copper film oriented mainly in a (111) direction so as to line an internal surface of the to-be-filled region; and forming a second copper film on the first copper film by plating so as to fill the to-be-filled region.

BRIEF DESCRIPTION OF THE SEVERAL VIEWS OF THE DRAWING

FIGS. 5A to 5C are cross sectional views sequentially showing steps of an electronic device manufacturing method according to a second embodiment of this invention;

FIGS. 6A and 6B are cross sectional views sequentially showing steps of a manufacturing method of an electronic device (catalyst metal layer) according to a third embodiment of this invention;

FIG. 8 is a cross sectional view for illustrating a problem occurring when an amorphous layer is not formed in the manufacturing method of the fourth embodiment.

DETAILED DESCRIPTION OF THE INVENTION

There will now be described embodiments of this invention with reference to the accompanying drawings.

Figure 1:
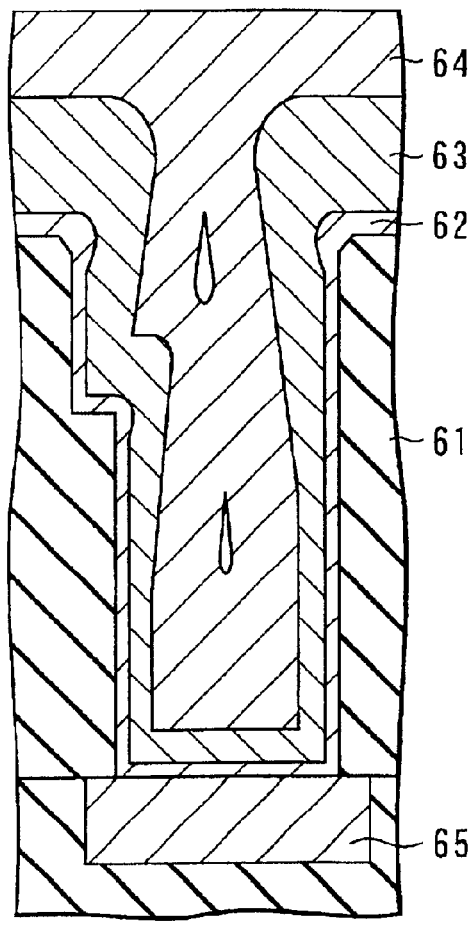
FIG. 1 is a view showing an interconnection structure for illustrating a problem occurring when the filling conductor is formed by plating.
Figure 2:
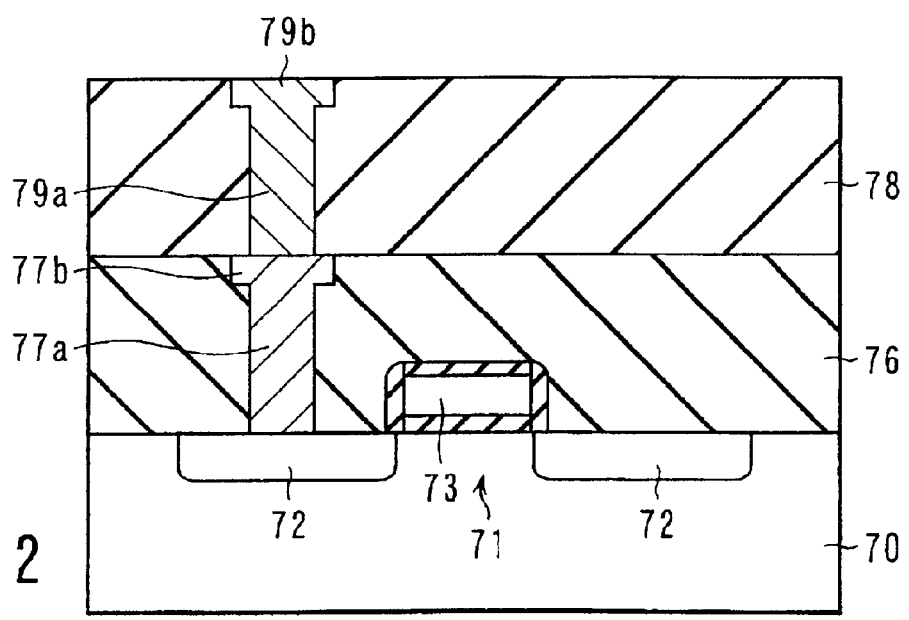
FIG. 2 is a cross sectional view showing an example of an electronic device to which the manufacturing methods according to embodiments of this invention are applied.

FIG. 2 is a cross sectional view showing part of a semiconductor integrated circuit as an example of an electronic device according to embodiments of this invention. A MOSFET 71 is formed on the surface of a semiconductor substrate 70. The MOSFET 71 has source/drain regions 72 and a gate electrode 73 insulated from and formed above a portion of the semiconductor substrate 70 which lies between the regions 72.

A first interlayer dielectric 76 is formed on the semiconductor substrate 70 to cover the MOSFET 71 and a contact 77a which is connected to one of the source/drain regions 72 and a first-layered interconnection 77b connected to the contact 77a are formed in a contact hole formed in the first interlayer dielectric 76.

A second interlayer dielectric 78 is formed on the first interlayer dielectric 76 and a via 79a and a second level interconnection 79b connected to the via 79a are formed to penetrate through the second interlayer dielectric 78. On the substrate, capacitors, magnetoresistive elements and the like can be formed in addition to the MOS transistor.

The following embodiments are explained by taking a method for forming interconnections corresponding to e.g. the via 79a and second level interconnection 79b as an example.

(First Embodiment)

FIGS. 3A to 3D are cross sectional views sequentially showing steps of an electronic device manufacturing method according to a first embodiment of this invention.

Figure 3A:
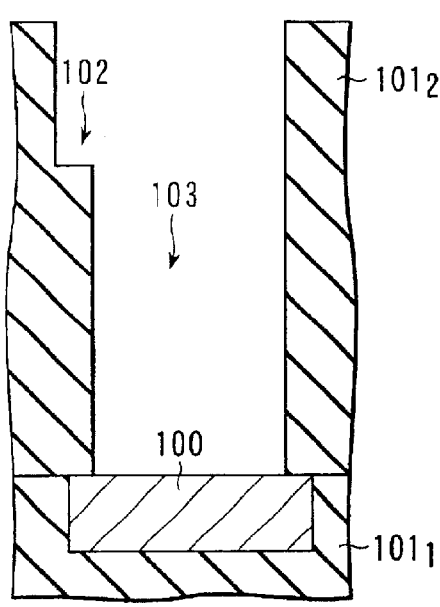
FIGS. 3A to 3D are cross sectional views sequentially showing steps of an electronic device manufacturing method according to a first embodiment of this invention.

First, as shown in FIG. 3A, a first interlayer dielectric $101_1$ is formed on a silicon substrate (not shown) on which active elements such as transistors and passive elements such as capacitors are integrated and a first level interconnection 100 is formed on the upper surface of the first interlayer dielectric. A second interlayer dielectric $101_2$ is formed on the first interlayer dielectric $101_1$ containing the first level interconnection 100.

Next, an interconnection groove 102 and via hole 103 are formed in the second interlayer dielectric $101_2$ by use of photolithography and dry etching (for example, RIE). The order of formation of the interconnection groove 102 and via hole 103 is not restricted as mentioned above. As the interlayer dielectrics $101_1$ and $101_2$, a fluorine added silicon oxide film is used, for example.

Figure 3B:
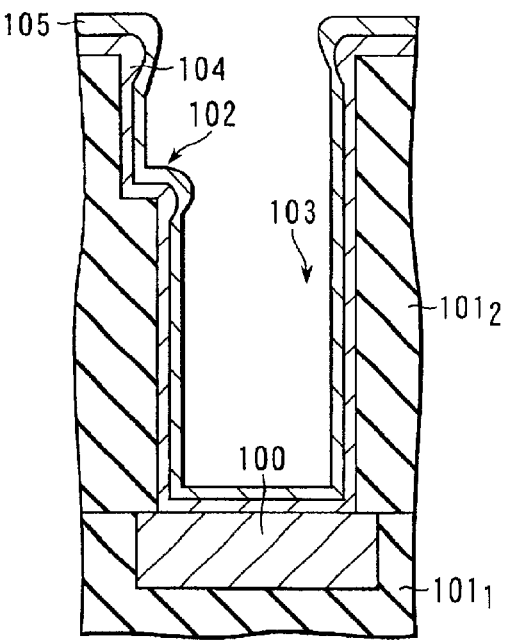

Next, as shown in FIG. 3B, a tantalum nitride film 104 used as a barrier metal film is deposited on the entire surface to coat the internal surfaces of the interconnection groove 102 and via hole 103.

In this embodiment, the film thickness of the tantalum nitride film 104 is 20 nm and the formation method thereof is a sputtering method. The barrier metal film is not limited to the tantalum nitride film 104 and a Ti/TiN film can be used, for example.

After this, a copper-palladium alloy film 105 (first conductive film) used as a seed layer for electrolyte plating is formed on the tantalum nitride film 104.

In this embodiment, the film thickness of the copper-palladium alloy film 105 is 20 nm and the formation method thereof is a sputtering method. A mosaic pattern target of copper and palladium is used as a sputter target. In this case, the concentration of palladium in the copper-palladium alloy film 105 is approximately 2 weight %. It is preferable that palladium is uniformly dispersed in the copper-palladium alloy film 105.

The overhang caused by formation of the copper-palladium alloy film 105 can be substantially neglected if the film thickness thereof is as low as approximately 20 nm. Further, the film thickness of the copper-palladium alloy film 105 becomes minimum in the bottom side wall portion of the via hole 103 and is concretely approximately 3.5 nm.

Further, since palladium acts as a material for enhancing the growth nucleus density of the copper-palladium alloy film 105, the growth nucleus density of the copper-palladium alloy film 105 becomes high. Therefore, even if the copper-palladium alloy film 105 with the small film thickness of 20 nm is used, the function thereof used as the seed layer can be maintained.

Figure 3C:
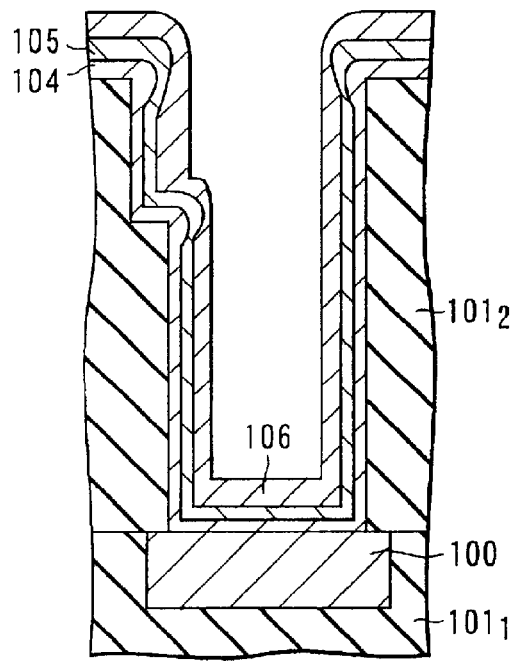

Next, as shown in FIG. 3C, a copper film 106 (second conductive film) with a film thickness of 80 nm is formed on the copper-palladium alloy film 105 by use of electroless plating. The copper film 106 is a film for supplementing the function of the copper-palladium alloy film 105 as the seed film.

In this embodiment, a plating solution used for the electroless plating is a solution containing formaldehyde of a copper sulfate base as a reducing agent and generally used in this industrial field. Electroless plating can provide a relatively uniform film growth speed in the groove or hole due to the deposition principle thereof. Therefore, the copper film 106 with a relatively uniform film thickness can be formed in the interconnection groove 102 and via hole 103.

Further, palladium of the copper-palladium alloy film 105 which is a liner of the copper film 106 acts as a catalyst in electroless plating. Therefore, the growth nucleus density of the copper film 106 is enhanced and an excellent surface morphology of the copper film 106 can be attained. That is, uneven portions which obstruct the electroplating are not formed on the surface of the copper film 106. Note that, as the catalyst, use is made of a metal whose ionization tendency is smaller than that of a main component (Cu in this case) of the first conductive film.

Figure 3D:
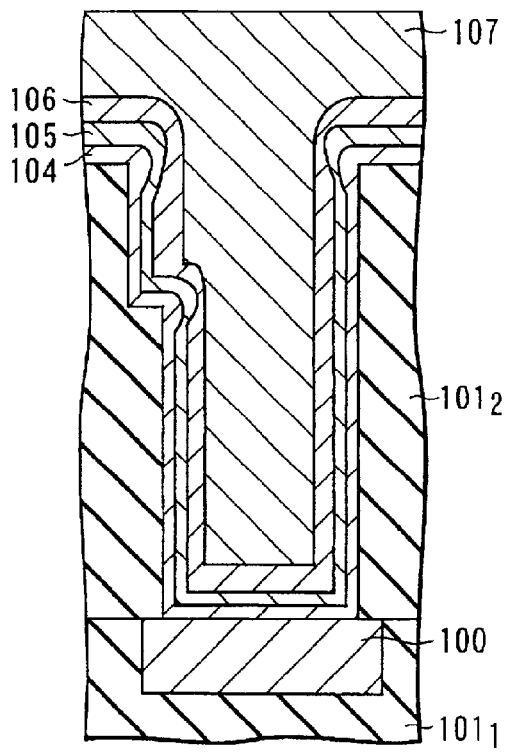

Next, as shown in FIG. 3D, a copper film 107 (third conductive film) with a film thickness of 80 nm used as an interconnection is formed on the entire surface of the structure by use of electroplating. At the time of electroplating the copper film 107, a laminated film of the tantalum nitride film 104, copper-palladium alloy film 105 and copper film 106 function as a feeder layer.

It is confirmed that the via hole 103 having an aspect ratio of 2 or more, for example, the via hole 103 with an opening diameter of 0.2 $\mu$m and a depth of 1.2 $\mu$m can be filled with the copper film 107 without forming voids or seams, by utilizing the above electroplating. That is, it becomes possible to form the copper film 107 having a good filling shape in the via hole 103 with a high aspect ratio (for example, 6).

The reason why the above result can be attained is that the surface morphology of the copper film 106 is improved so that electroplating the copper film 107 will not be obstructed, the copper film 106 with a relatively uniform film thickness can be formed since the electroless plating method is used as the formation method of the copper film 106, and the copper-palladium alloy film 105 which can enhance the growth nucleus density of the copper film 106 is used as the seed layer.

After this, unwanted portions of the copper films 106 and 107, copper-palladium alloy film 105, and tantalum nitride film 104 which lie outside the interconnection groove 102 are removed and the surface of the resultant structure is made flat by use of a CMP (Chemical Mechanical Polishing) method to complete a dual damascene interconnection of copper.

In the first embodiment, the film thickness of the copper-palladium alloy film 105 is set at 20 nm, but if the film thickness of the copper-palladium alloy film 105 is set in a range of 3 nm to 100 nm, it is possible to form the copper film 107 having a good filling shape.

Figure 4A:
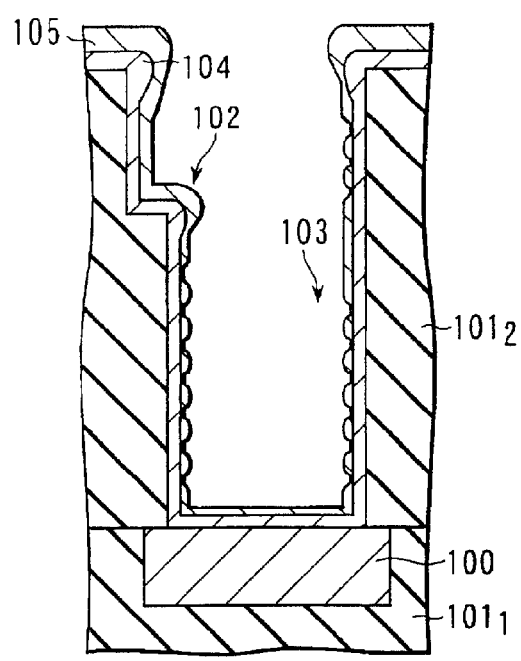
FIGS. 4A and 4B are cross sectional views showing an example in which a thin catalyst metal layer is formed in the first embodiment.

If the film thickness of the copper-palladium alloy film 105 formed by sputtering is reduced to approximately 3 nm, the copper-palladium alloy film 105 is agglomerated in various portions on the side wall of the via hole 103 by the surface tension as shown in FIG. 4A to form island portions as a film of discontinuity on the barrier layer 104. Incidentally, the film thickness in this case is an average film thickness.

Figure 4B:
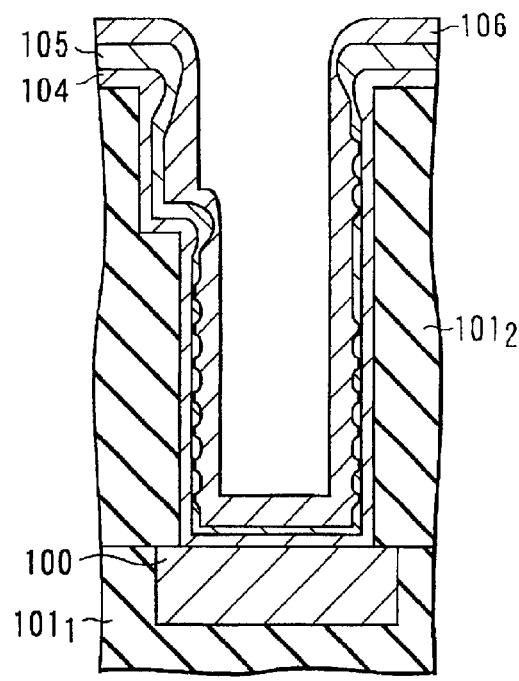

If the copper film 106 is plated on the thus formed copper-palladium alloy film 105 by electroless plating (FIG. 4B), the copper film 106 is preferentially formed on the copper-palladium alloy film 105 rather than on the tantalum nitride film 104 in a portion of the island-form copper-palladium alloy film 105. Therefore, in the growth process of the copper film 106, a problem that adjacent growth films obstruct the growth thereof with each other can be prevented. As a result, the copper film 106 with an extremely large diameter (1000 to 2500 nm) can be formed. The thus formed copper plating film has excellent EM resistance, low resistivity and excellent characteristic as an interconnection.

The content of copper in the first to third conductive films (copper-palladium alloy film 105, copper films 106, 107) is so selected as to lower the resistance of the interconnection than in a case where Al is used as an interconnection material. In order to serve the above purpose, it is preferable that the first to third conductive films contain copper at 50 atomic % or more.

Further, in the first embodiment, each of the first to third conductive films uses copper or copper alloy as a material, but this is not limitative and a material necessary for the final interconnection forming process can be adequately selected.

(Second Embodiment)

Figure 5A:
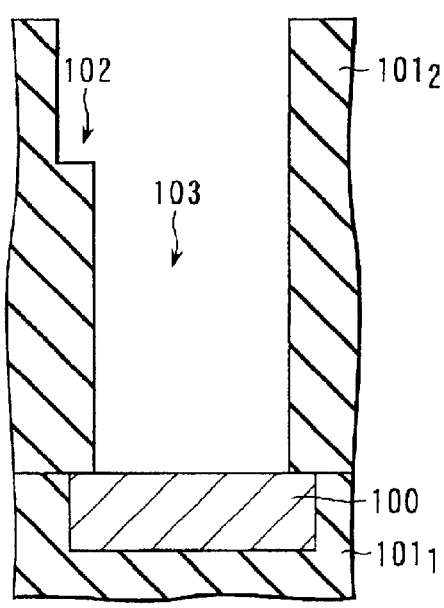
Figure 5B:
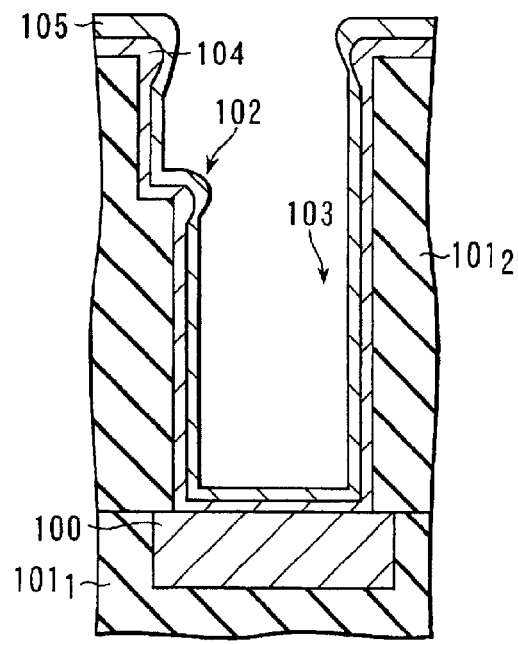

FIGS. 5A to 5C are cross sectional views sequentially showing steps of an electronic device manufacturing method according to a second embodiment of this invention. Portions in FIGS. 5A to 5C which are the same as those of FIGS. 3A to 3D are denoted by the same reference numerals and a detailed explanation thereof is omitted.

The second embodiment is different from the first embodiment in that a copper film 107 is formed on a copper-palladium alloy film 105 by electroplating (FIGS. 5A and 5C) instead of forming the copper film 106 on the copper-palladium alloy film 105 by electroless plating.

Also, in this embodiment, the copper film 107 having a good filling shape can be formed. The reason is that palladium of the copper-palladium alloy film 105 functions as a material for enhancing the growth nucleus density of the copper film 107. It is considered that the above function of palladium can be attained since the surface electronic state in which growth by electroplating may preferentially occur on palladium is set up, for example. Alternatively, it is also considered that palladium is more difficult to be oxidized than copper in the copper-palladium alloy film 105 and therefore a plating current is caused to easily flow.

Further, according to the second embodiment, since the step of forming the copper film 106 by use of electroless plating can be omitted, an advantage that the process can be made simpler in comparison with the first embodiment can be attained.

In the first embodiment, since the copper film 106 formed by electroless plating supplements the role of the copper-palladium alloy film 105 used as the seed layer, it is not necessary to increase the film thickness of the copper-palladium alloy film 105 according to an increase in the aspect ratio. Therefore, if the aspect ratio is increased in the future, the possibility that the first embodiment becomes advantageous over the second embodiment will be stronger.

(Third Embodiment)

FIGS. 6A and 6B are cross sectional views schematically showing a thin film, for illustrating an electronic device manufacturing method according to a third embodiment of this invention. The third embodiment is different from the first and second embodiments in that a copper-palladium alloy film 105 is formed by a substitution reaction, and other processes are the same as those of the first or second embodiments.

That is, as shown in FIG. 6A, a copper film 105' (fourth conductive film) containing niobium (Nb) in the surface portion thereof is formed on a barrier metal film 104 (not shown) by a known method (refer to FIG. 3B of the first embodiment).

Next, the copper film 105' (not shown) is substituted into a $PdCl_2$ solution and, as shown in FIG. 6B, Nb in the surface portion of the copper film 105' is substituted by Pd to form a copper-palladium alloy film 105.

Metal other than Nb can be used as metal contained in the copper film 105'. That is, metal which is different from Pd and has higher ionization tendency than Pd can be used. Preferably, metal having a higher ionization tendency than copper (which is metal of a main component constituting the first metal film) is used.

According to the third embodiment, the yield of a copper-palladium alloy can be enhanced in comparison with the first and second embodiments. That is, all of the copper and palladium particles (sputter particles) splashed over the substrate do not contribute to formation of a copper-palladium alloy in the case of a sputtering method, but in the case of the third embodiment, most of the Nb in the surface portion of the copper film 105' can be substituted by Pd and a copper-palladium alloy can be efficiently formed. It is not necessary to change the whole portion of the copper film 105' into the copper-palladium alloy film 105 and it is sufficient if the surface portion of the copper film 105' is changed into the copper-palladium alloy film 105.

After the copper-palladium alloy film 105 is formed, the same processes as those described in the first or second embodiment are performed to complete a dual damascene interconnection.

According to the electronic device manufacturing method described in the first to third embodiments, a second or third conductive film having a good filling shape can be formed in a to-be-filled region having a high aspect ratio which is at least two, by previously forming a first conductive film containing a preset material which enhances the growth nucleus density of the plating conductive film or catalyst metal in the electroless plating as a liner.

(Fourth Embodiment)

FIGS. 7A to 7D are cross sectional views sequentially showing steps of an electronic device manufacturing method according to a fourth embodiment of this invention.

First, like the first embodiment, a first interlayer dielectric $101_1$ is formed on a silicon substrate (not shown) on which active elements such as transistors and passive elements such as capacitors are integrated and a first interconnection layer 100 is formed on the upper surface of the first interlayer dielectric. A second interlayer dielectric $101_2$ is formed on the first interlayer dielectric $101_1$ containing the first interconnection layer 100.

Figures 7A, 7B:
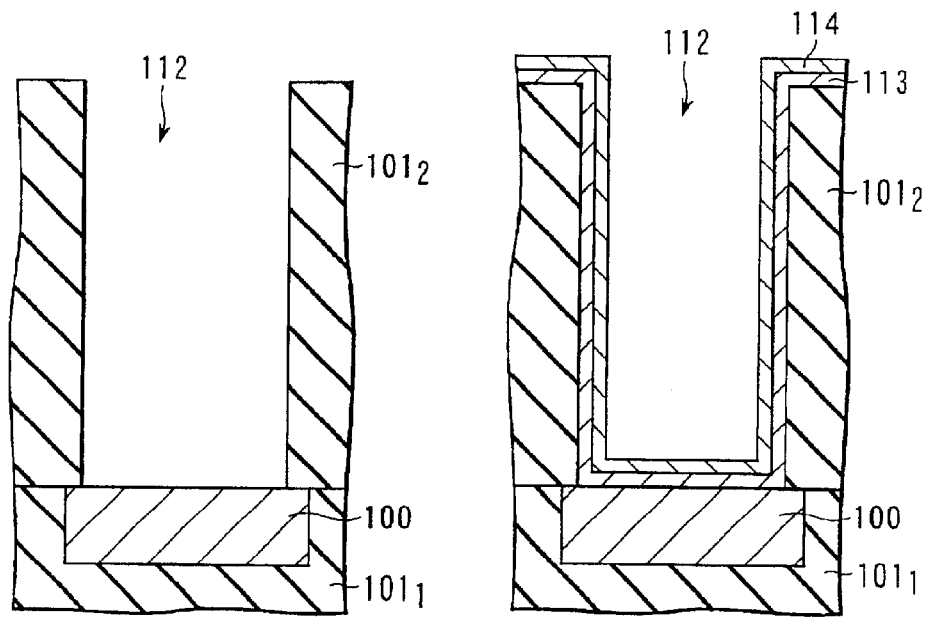
FIGS. 7A to 7D are cross sectional views sequentially showing steps of an electronic device manufacturing method according to a fourth embodiment of this invention.

Next, as shown in FIG. 7A, a via hole 112 is formed in the second interlayer dielectric $101_2$ by use of photolithography and dry etching (for example, RIE). As the interlayer dielectrics $101_1$ and $101_2$, a silicon oxide film formed by the CVD method is used. The opening diameter of the via hole 112 is 0.15 μm and the depth thereof is 600 nm.

Next, as shown in FIG. 7B, a tantalum nitride film 113 used as a barrier metal film is deposited on the entire surface of the structure so as to coat the internal surface of the via hole 112. Then, a copper film 114 is formed on the tantalum nitride film 113. In this embodiment, the film thickness of the tantalum nitride film 113 is 20 nm, the film thickness of the copper film 114 is 200 nm and the formation method of the tantalum nitride film 113 and copper film 114 is a sputtering method.

The copper film 114 acts as a feeder layer for electroplating together with an amorphous metal film to be formed in the later step and is inserted to lower the resistance of the feeder layer. Therefore, the copper film 114 is not indispensable, but preferable electroplating can be expected if the copper film 114 is provided.

Figures 7C, 7D:
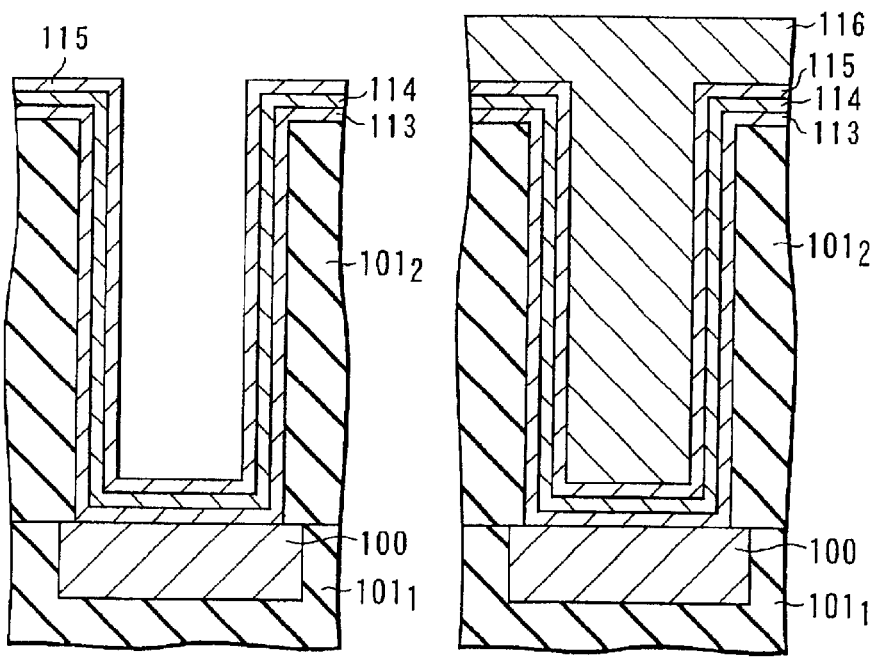

After this, as shown in FIG. 7C, an amorphous CuTa alloy film 115 is formed on the copper film 114. In this example, the film thickness of the amorphous CuTa alloy film 115 is 20 nm and the formation method thereof is a sputtering method. A mosaic pattern target of copper and tantalum is used as a sputter target.

Instead of the amorphous CuTa alloy film 115, another amorphous alloy film such as an amorphous CuZr alloy film, amorphous CuW alloy film, amorphous CuTi alloy film, amorphous CuHf alloy film, amorphous WCo alloy film or amorphous NiTa alloy film can be used. Further, the formation method of the above amorphous alloy films is not limited to a sputtering method and may be a plating method. Further, in this case, the copper film 114 is used as a liner of the amorphous CuTa alloy film 115, but another conductive film may be used as the liner.

Next, as shown in FIG. 7D, a copper film 116 having a film thickness of 1.2 μm is formed on the entire surface to fill the via hole 112 therewith. A copper sulfate solution is used as a plating solution, for example. Although an electroplating is used to form the copper film 116 in this embodiment, an electroless plating may be used, instead.

After this, unwanted portions of the copper film 116, amorphous CuTa alloy film 115, copper film 114 and tantalum nitride film 113 which lie outside the via hole 112 are removed and the surface of the resultant structure is made flat by use of the CMP method to complete a plug of copper.

The copper film 116 (via plug) in the via hole 112 was observed by use of SEM (Scanning Electron Microscope) and it was confirmed that the internal portion of the via hole 112 was filled with the copper film 116 without causing voids and seams.

It is considered that the reason why the above result is obtained is that the copper film 114 (low-resistance layer) on the upper surface of which the amorphous CuTa alloy film 115 is formed is used as the seed layer of the copper film 116 which is used as the plug in this embodiment, so that the nucleus growth of copper uniformly proceeds and the copper film 116 uniformly grows.

On the other hand, in the case of a plug formed of the copper film 116 which is formed by a similar method to the method used in this embodiment except that the amorphous CuTa alloy film 115 is not formed (comparison example), it is confirmed that nuclei 121 which grow large in some portions inside the via hole 112 are formed and voids and the like occur in the via hole 112 as shown in FIG. 8. In FIG. 8, for simplicity of the drawing, the tantalum nitride film 113 and copper film 114 are shown as a single-layered film.

It is considered that the reason why the above result is obtained is that the crystal orientations of crystal grains of the copper film 114 used as the seed layer are variously different so that the nucleus growth of copper non-uniformly proceeds in the comparison example.

According to the fourth embodiment, since the amorphous alloy film is formed on the uppermost surface used as an origin of plating, non-uniformity of growth of a conductive film formed by plating on the amorphous alloy film can be avoided. As a result, a conductive film (via plug) having a good filling (buried) shape can be formed in a to-be-filled region having a high aspect ratio which is at least two.

(Fifth Embodiment)

FIGS. 9A to 9D are cross sectional views sequentially showing steps of an electronic device manufacturing method according to a fifth embodiment of this invention. Portions in FIGS. 9A to 9D which are the same as those of FIGS. 7A to 7D are denoted by the same reference numerals and a detailed explanation thereof is omitted.

First, like the case of FIG. 7A, a silicon oxide film with a film thickness of 850 nm is formed as a second interlayer dielectric 101₂ on a first interlayer dielectric 101₁ having a first level interconnection 100 formed thereon by use of the CVD method.

Figure 9A:
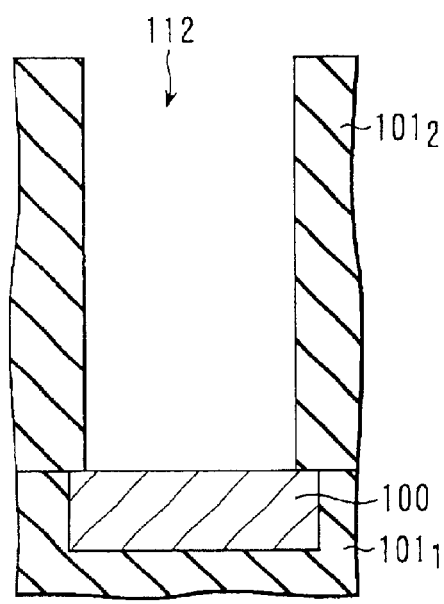
FIGS. 9A to 9D are cross sectional views sequentially showing steps of an electronic device manufacturing method according to a fifth embodiment of this invention.

Next, as shown in FIG. 9A, a via hole 112 with an opening diameter of 0.15 μm and a depth of 600 nm is formed in the second interlayer dielectric 101₂.

Figure 9B:
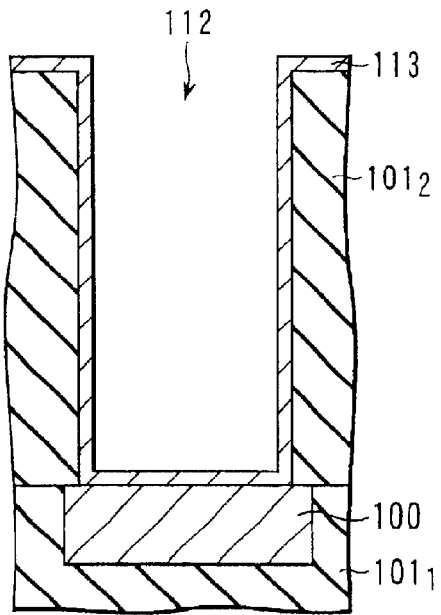

Then, as shown in FIG. 9B, a tantalum nitride film 113 with a film thickness of 20 nm as a barrier metal film is deposited on the entire surface of the structure by the sputtering method so as to coat the internal surface of the via hole 112. The processes up to the above step are the same as those described in the fourth embodiment.

Figure 9C:
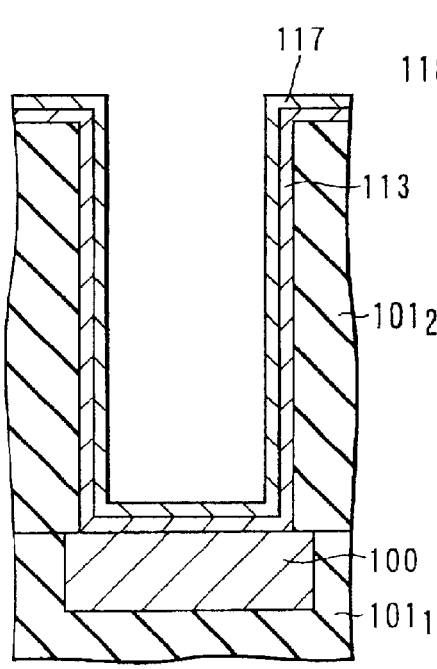

After this, as shown in FIG. 9C, an amorphous CuZr alloy film 117 with a film thickness of 20 nm is deposited on the tantalum nitride film 113 by the sputtering method. A mosaic pattern target of copper and zirconium is used as a sputter target.

Figure 9D:
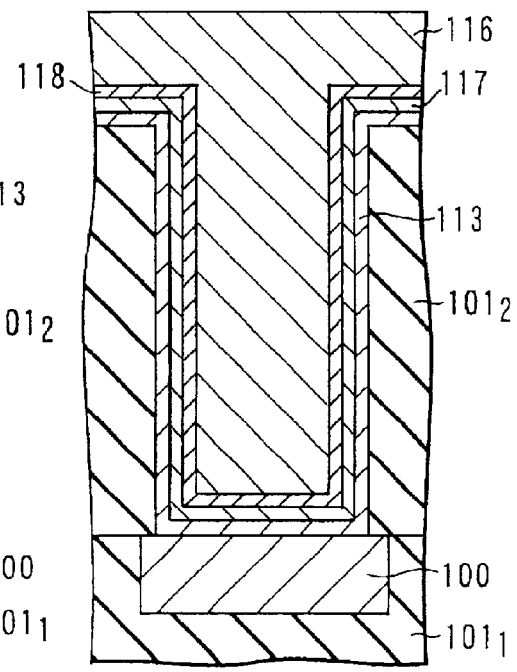

Next, as shown in FIG. 9D, a copper film 118 (first copper film) used as a seed layer is formed on the amorphous CuZr alloy film 117. As the above formation method, an electroplating method, electroless plating method, CVD method, sputtering method or the like can be used.

When the copper film 118 was checked by X-ray diffraction, a peak in an orientation other than the (111) direction was not observed. That is, it was made clear that a copper film 118 highly oriented in the (111) direction could be formed on the amorphous CuZr alloy film 117.

It was also confirmed that a copper film 118 with a high degree of orientation could be formed on another amorphous alloy film, such as an amorphous CuTa alloy film, amorphous CuW alloy film, amorphous CuTi alloy film, amorphous CuHf alloy film, amorphous WCo alloy film or amorphous NiTa alloy film.

Next, as shown in FIG. 9D, a copper film 116 (second copper film) is formed on the entire surface by use of electroplating or electroless plating and the via hole 112 is filled with the copper film 116.

After this, unwanted portions of the copper films 116 and 118, amorphous CuZr alloy film 117 and tantalum nitride film 113 which lie outside the via hole 112 are removed and the surface of the resultant structure is made flat by use of the CMP method to complete a via plug of copper.

The copper film 116 (via plug) in the via hole 112 was observed by use of SEM and it was confirmed that the internal portion of the via hole 112 could be filled with the copper film 116 without causing voids and seams.

It is considered that the reason why the above result is obtained is that, in this embodiment, the copper film 118 highly oriented in the (111) direction is formed as a seed layer of the copper film 116 which is used as a via plug so that the nucleus growth of copper uniformly proceeds and the copper film 116 uniformly grows.

The structure of the amorphous CuZr alloy film 117/ copper film 118 shown in FIG. 9D is maintained in the product stage depending on the process condition. That is, if the thermal process which crystallizes the whole portion of the amorphous CuZr alloy film 117 is not performed in a step after the structure of the amorphous CuZr alloy film 117/ copper film 118 is completed, the amorphous CuZr alloy film 117 is not removed and part of the alloy film is left behind.

According to the electronic device manufacturing method according to the fifth embodiment, since the degree of (111) orientation of the first copper film can be made extremely high, non-uniformity of growth of the second copper film formed on the first copper film by electroplating can be effectively avoided. As a result, a conductive film having a good filling shape can be formed in a to-be-filled region having a high aspect ratio which is at least two.

The reason why the degree of orientation of the first copper film can be made high is that it is much easier to uniformly grow the copper film in the (111) orientation on the amorphous film than in other crystal orientations. This is a novel fact found as the result of much study by the inventors of this application.

This invention is not limited to the above embodiments. For example, in the first to third embodiments, a case wherein this invention is applied to the dual damascene interconnection (DD inter-connection) is explained, but this invention can be applied to formation of a so-called single damascene interconnection (SD interconnection) or plug formation.

Further, in the fourth and fifth embodiments, a case wherein this invention is applied to the via plug is explained, but this invention can be applied to a DD interconnection or SD interconnection.

Further, this invention can be applied to a to-be-filled region other than the interconnection groove and contact/via hole, for example, a gate groove in the damascene gate process.

In addition, in the above embodiments, a case wherein palladium is used as the metal catalyst or preset metal in the first conductive film is explained, but gold, silver, platinum, or a metal containing at least two of palladium, gold, silver and platinum can be used instead of palladium.

As described above, according to this invention, a conductive film having a good filling (buried) shape can be formed in the internal portion of a to-be-filled region having a high aspect ratio by plating.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An electronic device manufacturing method comprising:

forming an insulating film above a substrate;

forming a to-be-filled region which includes at least one of an interconnection groove and a hole in the insulating film;

forming a first conductive film containing catalyst metal which accelerates electroless plating, so as to line an internal surface of the to-be-filled region;

forming a second conductive film on the first conductive film by the electroless plating, so as to line the internal surface of the to-be-filled region via the first conductive film; and forming a third conductive film on the second conductive film by electroplating, so as to fill the to-be-filled region via the first conductive film and the second conductive film, wherein said forming the first conductive film containing the catalyst metal comprises forming a fourth conductive film which includes the same main component as a main component of the first conductive film, and a to-be-substituted material different from the catalyst metal and having an ionization tendency larger than that of the catalyst metal on the insulating film, and dipping the substrate above which the insulating film and the fourth conductive film are formed into a solution containing the catalyst metal to substitute the catalyst metal for the to-be-substituted material in the fourth conductive film.

2. The electronic device manufacturing method according to claim 1, wherein the catalyst metal has smaller ionization tendency than a main component of the first conductive film.

3. The electronic device manufacturing method according to claim 1, wherein a copper content of each of the first conductive film, the second conductive film and the third conductive film is not less than 50 atomic %.

4. The electronic device manufacturing method according to claim 3, wherein the catalyst metal includes at least one selected from the group consisting of palladium, gold, silver and platinum.

5. The electronic device manufacturing method according to claim 1, wherein the to-be-substituted material has an ionization tendency larger than that of the main component of the first conductive film.

6. An electronic device manufacturing method comprising:

forming an insulating film above a substrate;

forming a to-be-filled region which includes at least one of an interconnection groove and a hole in the insulating film;

forming a first conductive film containing a preset material, so as to line an internal surface of the to-be-filled region; and forming a second conductive film on the first conductive film by plating, growth nucleus density of the second conductive film being enhanced by use of the preset material, wherein said forming the first conductive film containing the preset material comprises forming a third conductive film which includes the same main component as a main component of the first conductive film and a to-be-substituted material different from the preset material and having an ionization tendency larger than that of the preset material on the insulating film, and dipping the substrate above which the insulating film and the third conductive film are formed into a solution containing the preset material to substitute the preset material for the to-be-substituted material in the third conductive film.

7. The electronic device manufacturing method according to claim 6, wherein said forming the second conducive film includes forming a part of the second conductive film so as to line the internal surface of the to-be-filled region via the first conductive film by electroless plating, followed by filling the to-be-filled region via the first conductive film and the part of the second conductive film by electroplating.

8. The electronic device manufacturing method according to claim 6, wherein said forming the second conductive film includes filling the to-be-filled region therewith by electroplating.

9. The electronic device manufacturing method according to claim 6, wherein the preset material has smaller ionization tendency than a main component of the first conductive film.

10. The electronic device manufacturing method according to claim 6, wherein a copper content of each of the first conductive film and the second conductive film net is less than 50 atomic %.

11. The electronic device manufacturing method according to claim 10, wherein the preset material includes at least one selected from the group consisting of palladium, gold, silver and platinum.

12. The electronic device manufacturing method according to claim 6, wherein the to-be-substituted material has an ionization tendency larger than that of the main component of the first conductive film.

* * * * *